(12) United States Patent  (10) Patent No.: US 7,637,160 B2
Koury, Jr. et al.  (45) Date of Patent: Dec. 29, 2009

(54) MEMS SUSPENSION AND ANCHORING DESIGN

(75) Inventors: Daniel N. Koury, Jr., Mesa, AZ (US); Andrew C. McNeil, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 91 days.

(21) Appl. No.: 11/479,792

(22) Filed: Jun. 30, 2006

(65) Prior Publication Data

US 2008/0000297 A1  Jan. 3, 2008

(51) Int. Cl.
*G01P 15/125* (2006.01)

(52) U.S. Cl. .................. 73/514.32; 73/514.38
(58) Field of Classification Search ............. 73/514.32, 73/514.38
See application file for complete search history.

(56) References Cited

U.S. PATENT DOCUMENTS

| | | | | |
|---|---|---|---|---|
| 5,353,641 | A | * | 10/1994 | Tang ........................ 73/514.18 |
| 5,542,295 | A | * | 8/1996 | Howe et al. ............... 73/514.18 |
| 5,565,625 | A | | 10/1996 | Howe et al. |
| 5,583,291 | A | | 12/1996 | Gutteridge |
| 5,817,942 | A | | 10/1998 | Greiff |
| 5,834,332 | A | | 11/1998 | Hierold |
| 6,018,998 | A | * | 2/2000 | Zunino et al. ............. 73/514.16 |
| 6,122,963 | A | | 9/2000 | Hammond |
| 6,215,645 | B1 | | 4/2001 | Li et al. |
| 6,223,598 | B1 | | 5/2001 | Judy |
| 6,228,275 | B1 | | 5/2001 | Koch |
| 6,272,926 | B1 | * | 8/2001 | Fehrenbach et al. ....... 73/514.32 |
| 6,502,462 | B2 | * | 1/2003 | Sakai ....................... 73/514.32 |
| 6,782,749 | B2 | * | 8/2004 | Pinter ...................... 73/514.38 |
| 6,845,670 | B1 | | 1/2005 | McNeil |
| 6,936,492 | B2 | | 8/2005 | McNeil |
| 7,268,463 | B2 | * | 9/2007 | Li et al. ....................... 310/309 |

OTHER PUBLICATIONS

Hammond, Jonathan, et al., Internal Transducer Design for Manufacturability and Performance at Motorola, Transducers '03, The 12th International Conference on Solid State Sensors, Actuators and Microsystems, Boston, Jun. 6-12, 2003; pp. 85-90.

* cited by examiner

*Primary Examiner*—John E Chapman
(74) *Attorney, Agent, or Firm*—Ingrassia, Fisher & Lorenz, PC (57) ABSTRACT

A MEMS device that has a sensitivity to a stimulus in at least one sensing direction includes a substrate, a movable mass with corner portions suspended in proximity to the substrate, at least one suspension structure coupled approximately to the corner portions of the movable mass for performing a mechanical spring function, and at least one anchor for coupling the substrate to the at least one suspension structure. The at least one anchor is positioned approximately on a center line in the at least one sensing direction.

18 Claims, 3 Drawing Sheets

MEMS SUSPENSION AND ANCHORING DESIGN

FIELD OF THE INVENTION

The present invention generally relates to a MEMS device, particularly a MEMS suspension and anchoring design for a MEMS device.

BACKGROUND OF THE INVENTION

Many devices and systems include a number of different types of sensors that perform various monitoring and/or control functions. Advances in micromachining and other microfabrication processes have enabled the manufacture of a wide variety of microelectromechanical system (MEMS) devices.

A particular type of sensor that includes a MEMS device is an accelerometer that uses a movable mass to detect acceleration or other stimulus along a sensing direction. In a typical accelerometer, the movable mass forms part of a plurality of differential capacitor pairs. The motion of the movable mass is detected by a sensing circuit coupled to the differential capacitor pairs, and the acceleration of the MEMS device can be calculated.

The movable mass in a typical MEMS device is suspended in proximity to a substrate with one or more suspension structures. The suspension structures greatly affect the overall sensitivity of the MEMS devices, and therefore greatly affect the overall performance of the device. The actual sensitivity of the MEMS device can be offset relative to the intended sensitivity due to modeling inaccuracies, product variation, or design changes. Additional problems with conventional MEMS devices include susceptibility to the effects of package deformation and stiction.

Accordingly, it is desirable to provide a MEMS device that is resistant to the effects of package deformation, reduces the occurrence of stiction, and has an easily adjustable sensitivity.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description is merely exemplary in nature and is not intended to limit the invention or the application and uses of the invention. Furthermore, there is no intention to be bound by any theory presented in the preceding background of the invention or the following detailed description of the invention. In this regard, although the invention is depicted and described in the context of an accelerometer, it will be appreciated that the invention could be used for any one of the numerous devices that include a movable mass suspended by suspension structures in proximity to a substrate. The MEMS device discussed herein can include a plurality of chips in a common package, for example, one chip with the movable MEMS element and a separate chip for the circuitry, or a single, integrated chip.

Figure 1:
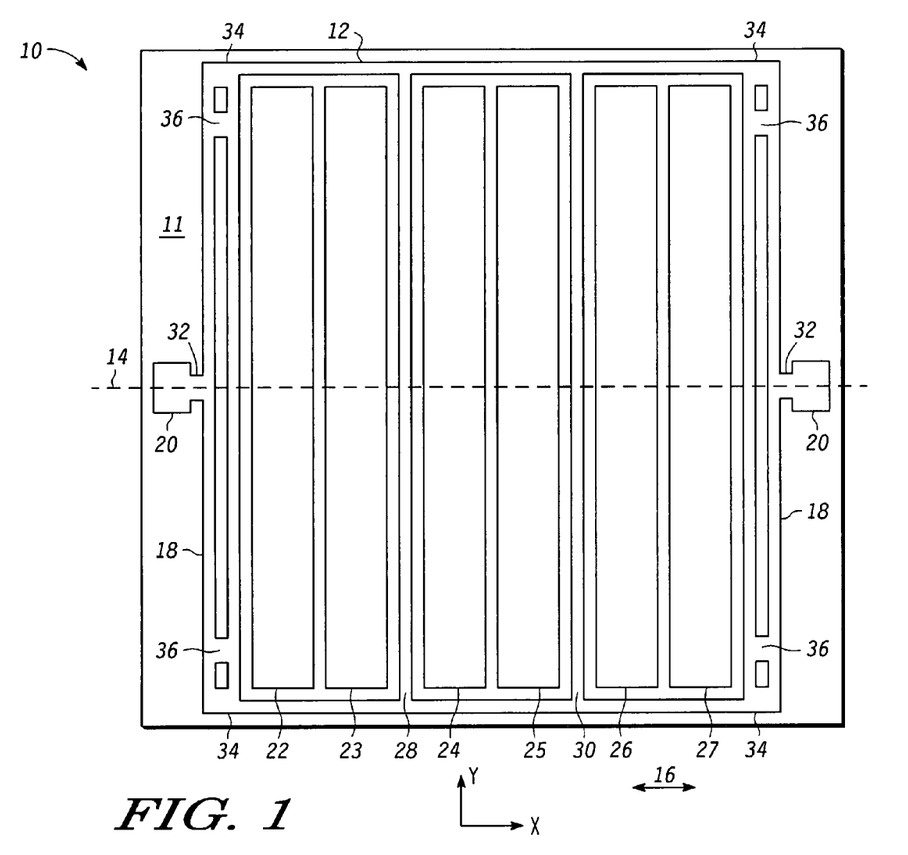
FIG. 1 illustrates a schematic, top plan view of a first embodiment of a MEMS device.

FIG. 1 is a schematic, top plan view of a MEMS device 10 according to one embodiment. In the specific embodiment described herein, the MEMS device 10 is used in an accelerometer. The MEMS device 10 has a movable mass 12 that moves in response to acceleration or other stimulus along a sensing direction in a plane substantially parallel to an underlying substrate 11. The substrate 11 can be, for example, a semiconductor substrate such as silicon, or the like.

The movable mass 12 generally moves in a lateral direction indicated by bi-directional motion axis arrow 16, which corresponds to the sensing axis or direction. The sensing direction 16 is substantially parallel to a centerline 14 of the movable mass 12. The movable mass 12 is supported at regular intervals by suspension structures 18. Anchors 20 mount the suspension structure 18 to the underlying substrate 11. Fixed electrodes 22, 23, 24, 25, 26, 27 are fixedly mounted to the substrate. At least part of the movable mass 12 is suspended between the fixed electrodes 22-27 to form a plurality of differential sensing capacitor pairs. Particularly, the movable mass 12 has segments 28, 30 that extend between fixed electrodes 23, 24 and fixed electrodes 25, 26, respectively, to form two differential capacitor pairs. As an example, when the movable mass 12 is subject to a stimulus in the sensing direction 16, for example acceleration, segment 28 moves relative to fixed electrode 23 and fixed electrode 24. As a result of the movement of segment 28, the capacitances between segment 28 and fixed electrode 23 and between segment 28 and fixed electrode 24 change. These changes can be measured to quantitatively reflect the amount of stimulus. Although six fixed electrodes 22-27 and two segments 28, 30 of the movable mass 12 are illustrated, any number of fixed electrodes or movable mass segments may be provided.

Each suspension structure 18 may include a "beam," "tether," "arm," or any other structure configured to perform a mechanical spring function and enable the movable mass 12 to move in response to acceleration or other stimulus along the sensing direction and return to its original position. The suspension structure 18 has a spring constant ($K_x$) along the sensing direction 16 that contributes to the sensitivity of the MEMS device 10.

As shown in FIG. 1, the suspension structures 18 of the MEMS device 10 extend from the anchors 20 at anchor attachment points 32 to the movable mass 12 at movable mass attachment points 34. The movable mass attachment points 34 can be at or near the corner portions of the movable mass 12. The movable mass 12 can be generally rectangular with four exterior sides intersecting at the corner portions. The term "rectangular" also includes a square, and additionally, other shapes of the movable mass 12 can be provided.

Locating the anchors 20 along a centerline 14 of the device 10 helps reduce sensitivity to package stress within the plane of the substrate and perpendicular to the sensitive axis 16. For example, in this perpendicular direction, in-plane strain would only stretch or contract the anchor itself and not change the relative separation of the two anchors. Strain in the sensitive direction would, in contrast, stretch or contract the anchor itself and change the relative separation of the two anchors 20. However, because this is the sensitive direction, the suspension structures 18 are able to accommodate displacements in this direction. Accordingly, in this embodiment that includes two anchors 20 separated along the sensitive direction 16 and on a centerline 14, sensitivity to package induced deformations is minimized, which helps reduce the temperature variability of the MEMS device 10.

The location of movable mass attachment points 34 approximately at the corner portions of the movable mass 12 in combination with the central location of the anchors 20 maximizes the restoring torque if the mass 12 were to rotate while reducing sensitivity to package induced deformations.

The suspension structures 18 generally have an odd number of segments that extend between the anchor attachment points 32 and the movable mass attachment points 34. However, the MEMS device 10 can also be designed such that the suspension structures 18 have an even number of segments. In the embodiment illustrated in FIG. 1, each suspension structure 18 has one segment that extends between each anchor attachment point 32 and movable mass attachment point 34.

The MEMS device 10 further includes at least one suspension link 36 that links portions of the suspension structures 18. During the design process, the suspension link 36 can be positioned or repositioned as necessary to provide the desired spring constant. The position of the suspension link 36 can effectively shorten or lengthen the suspension structure 18 and therefore increase or decrease the spring constant ($K_x$) of the MEMS device 10. In the illustrated MEMS device 10, there are four suspension links 36, one for each suspension structure 18. Each suspension structure 18 is effectively shortened to a length equivalent to the distance between the anchor attachment point 32 and the suspension link 36. The suspension link 36 can be composed of multiple links between the suspension structures 18 and the movable mass 12, although only a single suspension link 36 is shown in FIG. 1. If multiple links make up the suspension link 36, the links can be moved together as a unit to maintain a fixed spacing between the links, or the links can be moved proportionally so that the spacing between the links varies.

Each of the four suspension structures 18 can be designed in exactly the same manner so as not to introduce any unnecessary rotational motion of the movable element due to a linear acceleration with a component in the sensitive direction. One convenient way of accomplishing this it to build only one suspension structure 18 in the design or layout tool, and then place multiple copies of it appropriately rotated and/or mirrored. In this embodiment, the suspension links 36 would be designed as part of the suspension structure 18. The sensitivity of the MEMS device 10 can then be easily adjusted by making a single change within the design by repositioning the suspension link 36, and making a single new mask, reticle, or the like for the device fabrication. The easily adjustable design of the MEMS device sensitivity enables an easy adaptation to modeling inaccuracy, process variation, specification changes, or the creation of new products with different sensitivities.

Figure 2:
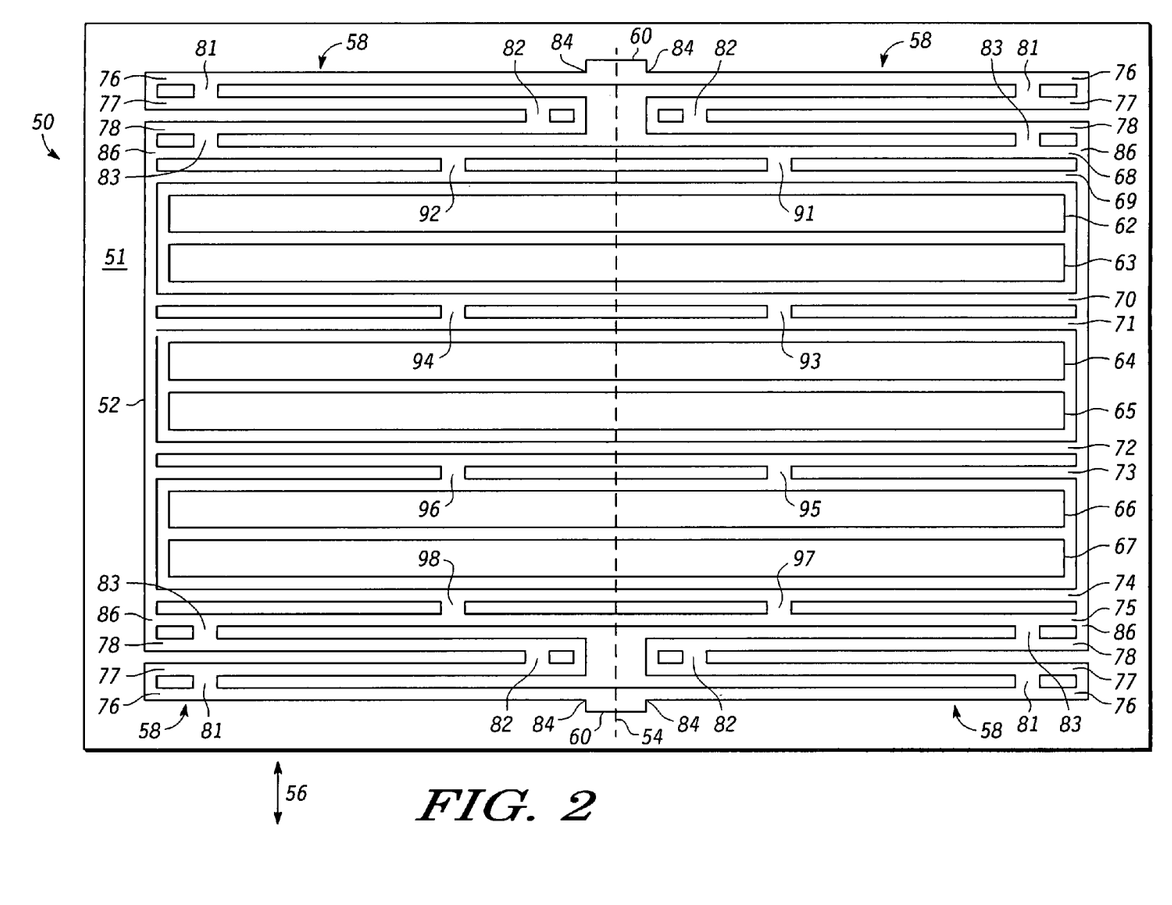
FIG. 2 illustrates a schematic, top plan view of a second embodiment of a MEMS device.

FIG. 2 illustrates an alternate embodiment of a MEMS device 50. The MEMS device 50 includes a movable mass 52 that moves in response to acceleration or other stimulus along a sensing direction 56. The movable mass 52 is supported by suspension structures 58, which are mounted to the underlying substrate 51 by anchors 60. Fixed electrodes 62, 63, 64, 65, 66, 67 and segments 69, 70, 71, 72, 73, 74 form a plurality of differential sensing capacitor pairs. Additional segments 68, 75 of the movable mass 52 attach the movable mass 52 to the suspension structures 58.

The MEMS device 50 of FIG. 2 includes suspension structures 58 that extend from the anchors 60 at anchor attachment points 84 to the movable mass 52 at movable mass attachment points 86. Similar to the MEMS device 10 in FIG. 1, the MEMS device 50 includes anchors 60 located along a center line 54 in the sensing direction 56, and the movable mass attachment points 86 can be at or near the corner portions of the movable mass 52.

In contrast to the MEMS device 10 in FIG. 1, the suspension structure 58 of the MEMS device 50 includes three segments 76, 77, 78. The three segments 76-78 form a serpentine arrangement with elbows. The segments 76-78 are joined at the elbows, which form, in the illustrated embodiment, two 90° angles. However, the elbow can have curved portions, and can be, for example, U-shaped. Moreover, the elbows can be formed of one or more additional segments.

The MEMS device 50 can further include at least one suspension link 81, 82, 83 positioned on the suspension structures 58. During the design process, the at least one suspension link 81, 82, 83 can be repositioned as necessary to provide the desired spring constant. The position of the suspension link 81, 82, 83 along the corresponding suspension segment 76, 77, 78 determines the effective length of the suspension structure 58 to make it longer or shorter. This results in a decrease or increase respectively in a spring constant Kx, generally in a sensitive direction. In the illustrated embodiment, three suspension links 81, 82, 83 are included for each suspension structure. A first suspension link 81 connects the first segment 76 of the suspension structure 58 extending from the anchor 60 to the second segment 77 of the suspension structure 58. A second suspension link 82 connects the second segment 77 of the suspension structure 58 to the third segment 78. A third suspension link 83 connects the third segment 78 of the suspension structure 58 to the movable mass 52. The effective lengths of the first, second, and third segments 76-78 can be manipulated by repositioning one or more of the suspension links 81-83 during the design and fabrication of the MEMS device 50. It is noted that moving the third suspension link 83 has the additional effect of changing the moment arm of the restoring torque in case of movable mass rotation. In the illustrated embodiment, the position of the suspension link 83 affects the effective length of only one suspension segment 78, while suspension links 81 and 82 each affect the effective length of two segments 76, 77 and 77, 78. In an alternate embodiment, a suspension link can be provided to connect the first suspension segment 76 to the anchor 60 at a position other than the anchor attachment point 84.

The MEMS device 50 can further include mechanical stiffening links 91-98 to link portions of the movable mass 52. Links 91 and 92 connect movable mass segments 68 and 69. Links 93 and 94 connect movable mass segments 70 and 71. Links 95 and 96 connect movable mass segments 72 and 73. Links 97 and 98 connect movable mass segments 74 and 75. These links 91-98 may be structurally similar to the suspension links 81-83 and both are easily adjustable during the design process. The stiffening links 91-98 and the pairs of movable mass segments 68-75 can make the movable mass 52 more rigid so that it moves with minimum of internal deformation.

In the embodiment shown in FIG. 2, there are two stiffening links 91-98 for each movable mass segment pair 68-75 to divide the length of the movable mass segments 68-75 approximately into thirds. The number of stiffening links 91-98 and/or the number of movable mass segments 68-75 can be increased to increase the rigidity and sensitivity of the MEMS device 50. Conversely, the number of stiffening links 91-98 and/or the number of movable mass segments 68-75 can be decreased to decrease the sensitivity of the MEMS device 50. To further decrease the sensitivity, the stiffening links 91-98 can be provided at a position closer to the ends of the movable mass segments 68-75 to leave, for example, more than 50% of the central portions of the movable mass segments 68-75 without stiffening links 91-98.

The suspension links 81-83 and stiffening links 91-98 can be distinguished, for example, by location. The stiffening links 91-98 connect different segments of the movable mass and are located internal to the movable mass and often adjacent to fixed electrodes forming part of the sense capacitors. In contrast, a suspension link 81-83 can make contact with the suspension structure to accomplish its desired function.

Moreover, the suspension links 81-83 and stiffening links 91-98 can be distinguished based on the effect on performance of the MEMS device 50. In the case of the stiffening links 91-98, the sensitivity and other key design parameters are generally insensitive to small motions of the individual stiffening links 91-98. In the case of the suspension links 81-83, due to its location in contact to the suspension structure 58, the spring constant and mechanical sensitivity of the device 50 can be very sensitive to changes in the suspension links 81-83. Since the spring constant of simple, straight suspension segment is inversely proportional to the cube of the length, it can be appreciated that even a small motion of a suspension link 81-83 can have a significant effect on the sensitivity.

Additionally, in some embodiments, the suspension links 81-83 result in the presence of an additional length of suspension structure that could be removed with little effect on the device performance if it was not intended to allow motion of the suspension link 81-83. For example, suspension link 81 results in an area of suspension structure extending beyond the suspension link 81 that may have no function in the device, except to function as a portion of suspension structure that enables the suspension link 81 to be further adjusted within the design. In contrast, the stiffening links 91-98 are typically provided in areas in which the full length of the segments 68-75 are needed for electrical connectivity, mechanical integrity, or other purposes. For example, segments 69-74 also provide the sense capacitance and segments 68, 75 provide a site to attach the suspension elements 58. Accordingly, in the example shown, although not limiting, stiffening elements 91-98 are provided on segments with portions extending beyond the stiffening elements that provide additionally functionality to the segment, in contrast with the case of the suspension links 81-83.

The stiffening links 91-98 along the corresponding pairs of linked movable mass segments 68-75 can dramatically increase the stiffness compared to the movable mass segments connected only at the ends. The stiffening links 91-98 can be arranged to approximate the stiffness of solid beams that take up the same rectangular footprints as the pairs of segments 68-75 with the stiffening links 91-98. The stiffening links 91-98 and corresponding movable mass segments 68-75 can, for example, approximate the behavior of an "I beam" in which the strength is similar to a solid beam with a rectangular cross section. This provides the desired stiffness without a large increase in mass. As such, the stiffening links 91-98 will typically fill only a small fraction of the open gap between the pairs of parallel adjacent movable mass segments 68-75. The stiffening links 91-98 along a particular pair of linked movable mass segments 68-75 can have an aggregate length that is less than 20% of the length of the mass segments 68-75. For example, stiffening links 95 and 96 have a combined length that is much less than 20% of the length of movable mass segments 74 or 75. This approach can be particularly useful in designing MEMS devices to sense large external signals, for example high accelerations, which require a low sensitivity. In these situations, the capacitor portions of a MEMS device should be stiff to minimize deformation of the capacitor plates, but without a large increase in the mass of the movable mass to maintain the low sensitivity.

In each of the embodiments described herein, the number and position of the suspension links can be manipulated to result in the desired sensitivity of the MEMS device.

Figure 3:
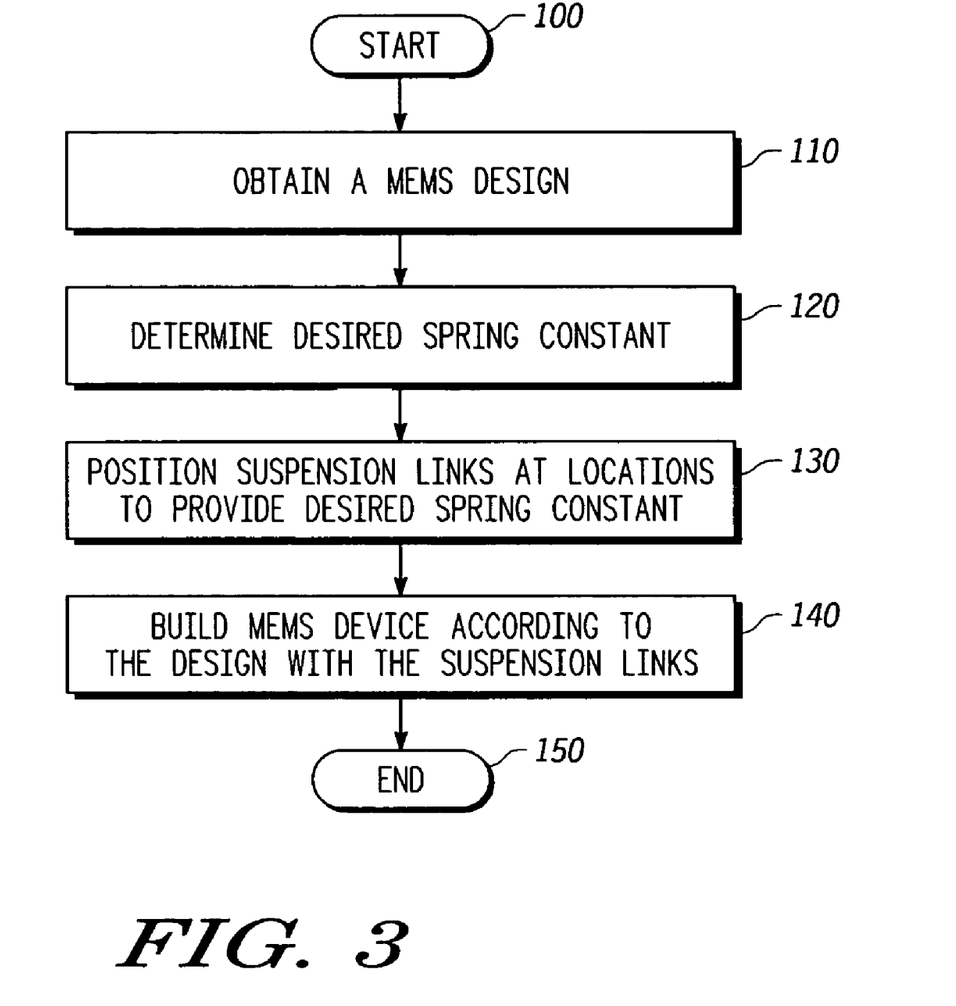
FIG. 3 illustrates a design and fabrication process according to one embodiment.

FIG. 3 illustrates a design and fabrication process according to one embodiment. The process starts in step 100, and in step 110, a MEMS design is obtained. In step 120, the desired spring constant of the MEMS device is determined. In step 130, suspension links are positioned at locations to provide desired spring constant. In step 140, the MEMS device is fabricated according to the design with the suspension links positioned to provide the desired spring constant, and the process ends in step 150.

The MEMS devices described herein can be fabricated using conventional techniques, except as discussed herein with respect to the novel aspects. In one embodiment, referring to FIG. 1, the substrate 11 can be provided. If the substrate 11 is substantially conducting, an insulating layer (not shown) such as silicon nitride or oxide plus nitride may be provided as necessary to maintain electrical isolation of the overlying layer or to reduce parasitic capacitances. A sacrificial layer (not shown) is deposited over the substrate 11. The sacrificial layer can comprise phosphorosilicate glass (PSG), but may comprise other sacrificial materials as are known in the art. A series of contact openings can then be formed in the sacrificial layer to define the position of the anchors 20 and the fixed electrodes 22-27. If the sacrificial layer is PSG, this may be accomplished by a suitable oxide etch that exhibits etch stop behavior at the substrate 11. A conductive material is deposited in the openings and overlying the sacrificial layer. The conductive material may comprise polysilicon, which may be suitably doped in some applications, but may also comprise other semiconductor materials or various metals. The conductive layer may be deposited through chemical vapor deposition (CVD) or by other suitable means as are known in the art. The conductive layer is then masked, patterned, and etched to define the movable mass 12, the suspension structures 18, the suspension links 36, the anchors 20, and the fixed electrodes 22-27. Release of the movable mass 12 and suspension structures 18 is achieved through the use of a suitable etchant to remove the sacrificial layer. If the sacrificial layer is PSG, the etchant can be HF. The movable mass 12, the fixed electrodes 22, the suspension structures 18, and the suspension links 36 can also be formed by a plurality of layers. As used herein "conductive" is intended to mean that either a material is a true conductor, such as a metal, or that the material has been doped or otherwise treated to improve its electrical conductivity, such as by doping a semiconductor material.

One embodiment has been described above with respect to an accelerometer. However, the embodiments can be used in other applications such as micromechanical relays, safing switches, angular rate sensors, and the like. It should also be noted that two sensing structures as described above can be positioned orthogonally on a single substrate to provide a two-axis (i.e. X-Y axis) accelerometer unit or on multiple substrates to form a 3-axis accelerometer unit.

It is also possible to use suspension links on a transducer that provides multiple axes of sensitivity with a single movable mass element. In this case, different suspension links can adjust different axis sensitivities nearly independently, or a single suspension link can adjust the sensitivities of multiple axes simultaneously.

In accordance with one embodiment, a MEMS device having a sensitivity to a stimulus in at least one sensing direction comprises a substrate; a movable mass with corner portions suspended in proximity to the substrate; at least one suspension structure coupled approximately to the corner portions of the movable mass for performing a mechanical spring function; and at least one anchor for coupling the substrate to the at least one suspension structure. The at least one anchor is positioned approximately on a center line in the at least one sensing direction.

The movable mass can be generally rectangular and include four exterior sides intersecting at the corner portions. The at least one suspension structure have an odd number of segments, including a single segment or three segments. The device can further include at least one suspension link positioned on the at least one suspension structure for controlling the sensitivity of the MEMS device. The at least one suspension link can effectively shortens the at least one suspension structure. The at least one suspension structure can comprise at least one segment with two end portions, and the at least one suspension link can be positioned at a position other than the two end portions. The device can further include a plurality of fixed electrodes, with the movable mass and the plurality of fixed electrodes forming at least one sensing capacitor that measures acceleration of the MEMS device in the at least one sensing direction.

In another embodiment, a MEMS device having a sensitivity to a stimulus in at least one sensing direction comprises a substrate; a movable mass suspended in proximity to the substrate; at least one suspension structure coupled to the movable mass for performing a mechanical spring function; and at least one suspension link positioned on the at least one suspension structure for controlling the sensitivity of the MEMS device.

The at least one suspension link can effectively shorten the at least one suspension structure. The at least one suspension structure can comprise at least one segment with two end portions, and the at least one suspension link can be positioned at a position other than the two end portions. The at least one suspension structure can be coupled to the movable mass at least one first attachment point, and the suspension link can additionally couple the at least one suspension structure to the movable mass at a position other than the at least one first attachment point. The device can further include at least one anchor for coupling the at least one suspension structure to the substrate. The at least one suspension structure can include first, second, and third segments. The first segment can be connected to the anchor at an anchor attachment point and to the second segment at a first elbow; the second segment can be connected to the third segment at a second elbow; and the third segment can be connected to the movable mass at a movable mass attachment point. The at least one suspension link can comprise at least one of: a first suspension link that links the first and second segments at a position other than the first elbow, a second suspension link that links the second and third segments at a position other than the second elbow, and a third suspension link that links the third segment to the movable mass at a position other than the movable mass attachment point. The movable mass can include a plurality of parallel segments, each with end portions, and the device can further include at least one stiffening link that links two segments of the movable mass at a position other than the end portions.

In another embodiment, a method is provided for manufacturing a MEMS device having a sensitivity to a stimulus in at least one sensing direction. The method includes providing a substrate; and providing a movable mass suspended in proximity to the substrate on at least one suspension structure coupled to the substrate with at least one anchor approximately on a center line in the sensing direction, with the movable mass suspended approximately at corner portions.

The method can further include the step of positioning at least one suspension link on the at least one suspension structure to control the sensitivity of the MEMS device. The suspension structure can comprise at least one segment with two end portions, and the positioning step can include positioning the at least one suspension link at a position other than the two end portions.

In another embodiment, A MEMS device having a sensitivity to a stimulus in at least one sensing direction comprises a substrate; a movable mass suspended in proximity to the substrate and including a plurality of parallel segments, each with end portions; at least one suspension structure coupled to the movable mass for performing a mechanical spring function; and at least one stiffening link that links two segments of the movable mass at a position other than the end portions.

In another embodiment, a method is provided for designing and fabricating a MEMS device having a movable mass suspended in proximity to a substrate by suspension structures. The method includes obtaining a MEMS design; determining a desired spring constant; positioning at least one suspension link on the suspension structures at a position to obtain the desired spring constant; and fabricating the MEMS device according to the design with the at least one suspension link.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A MEMS device having a sensitivity to a stimulus in at least one sensing direction, comprising:
   a substrate;
   a movable mass suspended in proximity to the substrate, wherein the movable mass has corner portions;
   at least one suspension structure coupled approximately to the corner portions of the movable mass for performing a mechanical spring function;
   at least one anchor for coupling the substrate to the at least one suspension structure, wherein the at least one anchor is positioned approximately on a center line in the at least one sensing direction,
   wherein the at least one suspension structure is formed by a set of n segments that extend completely between the movable mass and the at least one anchor, wherein n is at least three and an odd integer, the segments being generally parallel to one another, each segment being generally straight and having two ends, each of the ends being coupled to one of the movable mass, the at least one anchor, or another segment end; and
   at least one suspension link positioned on the at least one suspension structure for controlling the sensitivity of the MEMS device.

2. The MEMS device of claim 1, wherein the movable mass is generally rectangular and includes four exterior sides intersecting at the corner portions.

3. The MEMS device of claim 1, wherein the at least one suspension structure has only three segments.

4. The MEMS device of claim 1, wherein the at least one suspension link effectively shortens the at least one suspension structure.

5. The MEMS device of claim 1, wherein the at least one suspension structure comprises at least one segment with two end portions, and wherein the at least one suspension link is positioned at a position other than the two end portions.

6. The MEMS device of claim 1, further comprising a plurality of fixed electrodes, wherein the movable mass and the plurality of fixed electrodes form at least one sensing capacitor that measures acceleration of the MEMS device in the at least one sensing direction.

7. The MEMS device of claim 1, further comprising at least one anchor for coupling the at least one suspension structure to the substrate,
wherein the at least one suspension structure has first, second, and third segments,
wherein the first segment is connected to the anchor at an anchor attachment point and to the second segment at a first elbow, the second segment is connected to the third segment at a second elbow, and the third segment is connected to the movable mass at a movable mass attachment point, and
wherein the at least one suspension link comprises at least one of:
a first suspension link that links the first and second segments at a position other than the first elbow,
a second suspension link that links the second and third segments at a position other than the second elbow, or
a third suspension link that links the third segment to the movable mass at a position other than the movable mass attachment point.

8. A MEMS device having a sensitivity to a stimulus in at least one sensing direction, comprising:
a substrate;
a movable mass suspended in proximity to the substrate;
at least one suspension structure coupled to the movable mass for performing a mechanical spring function, wherein the at least one suspension structure is formed by a set of n segments that extend completely between the movable mass and the at least one anchor, wherein n is at least three and an odd integer, the segments being generally parallel to one another, each segment being generally straight and having two ends, each of the ends being coupled to one of the movable mass, the at least one anchor, or another segment end; and
at least one suspension link positioned on the at least one suspension structure for controlling the sensitivity of the MEMS device.

9. The MEMS device of claim 8, wherein the at least one suspension link effectively shortens the at least one suspension structure.

10. The MEMS device of claim 8, wherein the at least one suspension link is positioned at a position other than the ends.

11. The MEMS device of claim 8, wherein the at least one suspension structure is coupled to the movable mass at least one first attachment point, and wherein the suspension link additionally couples the at least one suspension structure to the movable mass at a position other than the at least one first attachment point.

12. The MEMS device of claim 8, farther comprising at least one anchor for coupling the at least one suspension structure to the substrate,
wherein the at least one suspension structure has first, second, and third segments,
wherein the first segment is connected to the anchor at an anchor attachment point and to the second segment at a first elbow, the second segment is connected to the third segment at a second elbow, and the third segment is connected to the movable mass at a movable mass attachment point, and
wherein the at least one suspension link comprises at least one of:
a first suspension link that links the first and second segments at a position other than the first elbow,
a second suspension link that links the second and third segments at a position other than the second elbow, or
a third suspension link that links the third segment to the movable mass at a position other than the movable mass attachment point.

13. The MEMS device of claim 8, wherein the device further comprises at least one stiffening link that links two segments of the movable mass at a position other than the ends.

14. A method of manufacturing a MEMS device having a sensitivity to a stimulus in at least one sensing direction, comprising:
providing a substrate;
providing a movable mass suspended in proximity to the substrate on at least one suspension structure coupled to the substrate with at least one anchor approximately on a center line in the sensing direction, wherein the movable mass is suspended approximately at corner portions by a suspension structure, the suspension structure being formed by a set of n segments that extend completely between the movable mass and the at least one anchor, wherein n is at least three and an odd integer, the segments being generally parallel to one another, each segment being generally straight and having two ends, each of the ends being coupled to one of the movable mass, the at least one anchor, or another segment end; and
positioning at least one suspension link on the at least one suspension structure to control the sensitivity of the MEMS device.

15. The method of claim 14, wherein the positioning step includes positioning the at least one suspension link at a position other than the ends.

16. A MEMS device having a sensitivity to a stimulus in at least one sensing direction, comprising:
a substrate;
a movable mass suspended in proximity to the substrate and including a plurality of parallel segments, each with end portions;
at least one suspension structure coupled to the movable mass for performing a mechanical spring function, wherein the at least one suspension structure is formed by a set of n segments that extend completely between the movable mass and the at least one anchor, wherein n is at least three and an odd integer, the segments generally parallel to one another, each segment being generally straight with two ends, each of the ends being coupled to one of the movable mass, at least one anchor, or another segment end; and
at least one stiffening link that links two segments of the movable mass at a position other than the end portions.

17. The MEMS device of claim 16, further comprising at least one anchor for coupling the at least one suspension structure to the substrate,
wherein the at least one suspension structure has first, second, and third segments,
wherein the first segment is connected to the anchor at an anchor attachment point and to the second segment at a first elbow, the second segment is connected to the third segment at a second elbow, and the third segment is connected to the movable mass at a movable mass attachment point, and wherein the at least one suspension link comprises at least one of:

a first suspension link that links the first and second segments at a position other than the first elbow, a second suspension link that links the second and third segments at a position other than the second elbow, or a third suspension link that links the third segment to the movable mass at a position other than the movable mass attachment point.

18. A method for designing and fabricating a MEMS device having a movable mass suspended in proximity to a substrate by suspension structures, the method comprising:

obtaining a MEMS design;

determining a desired spring constant;

positioning at least one suspension link on the suspension structures at a position to obtain the desired spring constant; and fabricating the MEMS device according to the design with the at least one suspension link, wherein the MEMS device includes a movable mass coupled to an anchor with a suspension structure, the suspension structure being formed by a set of n segments that extend completely between the movable mass and the at least one anchor, wherein n is at least three and an odd integer, the segments being generally straight and having two ends, each of the ends being coupled to one of the movable mass, at least one anchor, or another segment end.

* * * * *

UNITED STATES PATENT AND TRADEMARK OFFICE
CERTIFICATE OF CORRECTION

| | | |
|---|---|---|
| PATENT NO. | : 7,637,160 B2 | Page 1 of 1 |
| APPLICATION NO. | : 11/479792 | |
| DATED | : December 29, 2009 | |
| INVENTOR(S) | : Daniel N. Koury, Jr. et al. | |

It is certified that error appears in the above-identified patent and that said Letters Patent is hereby corrected as shown below:

Column 9, line 60 "farther" should be changed to --further--.

Signed and Sealed this

Sixteenth Day of February, 2010

David J. Kappos
*Director of the United States Patent and Trademark Office*